(12) United States Patent
Woerlee et al.

(10) Patent No.: US 7,232,734 B2
(45) Date of Patent: Jun. 19, 2007

(54) RADIATION EMITTING SEMICONDUCTOR DEVICE AND METHOD OF MANUFACTURING SUCH A DEVICE

(75) Inventors: Pierre Hermanus Woerlee, Eindhoven (NL); Gert Wim 'T Hooft, Eindhoven (NL); Jisk Holleman, Enschede (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 34 days.

(21) Appl. No.: 10/534,385

(22) PCT Filed: Oct. 31, 2003

(86) PCT No.: PCT/IB03/04881

§ 371 (c)(1),
(2), (4) Date: May 6, 2005

(87) PCT Pub. No.: WO2004/042831

PCT Pub. Date: May 21, 2004

(65) Prior Publication Data

US 2006/0043381 A1    Mar. 2, 2006

(30) Foreign Application Priority Data

Nov. 7, 2002   (EP)   .................................. 02079677

(51) Int. Cl.
*H01L 21/331*   (2006.01)
(52) U.S. Cl. ..................................................... 438/378
(58) Field of Classification Search ................ 257/292; 438/378
See application file for complete search history.

(56) References Cited

U.S. PATENT DOCUMENTS 5,438,210 A    8/1995  Worley
2005/0167709 A1*  8/2005  Augusto ..................... 257/292

* cited by examiner

*Primary Examiner*—Carl Whitehead, Jr.
*Assistant Examiner*—Monica D. Harrison
(74) *Attorney, Agent, or Firm*—Adam L. Stroud

(57) ABSTRACT

Radiation-emitting semiconductor device and method of manufacturing such a device. The invention relates to a radiation-emitting semiconductor device (10) comprising a silicon-containing semiconductor body (1) and a substrate (2), which semiconductor body (1) comprises a lateral semiconductor diode positioned on an insulating layer (7) which separates the diode from the substrate (2). The lateral semiconductor diode comprises a first semiconductor region (3) of a first conductivity type and with a first doping concentration, a second semiconductor region (4) of the first or a second conductivity type opposite to the first conductivity type and with a second doping concentration which is lower than the first doping concentration, and a third semiconductor region (5) of the second conductivity type and with a third doping concentration which is higher than the second doping concentration, the first and the third region (3, 5) each being provided with a connection region (6, 8), and, during operation, radiation (S) being generated in the second region (4) due to recombination of charge carriers injected therein from the first and the third region (3, 5). According to the invention, the second semiconductor region (4) comprises a central part (4A) which is surrounded by a further part (4B) the bandgap of which is larger than the bandgap of the central part (4A). In this way, the radiation yield is increased in an indirect semiconductor material such as silicon in the central part (4A) as translation of the relatively long-living charge carriers towards a non-radiative recombination center is limited because of the barriers in the valence and conduction band in the further part (4B). Preferably, the bandgap in the further part (4B) is made larger in that the thickness of said part (4B) is so small that quantum size effects occur therein, while the central part (4A) has a thickness which is so large that such effects do not occur or substantially do not occur.

15 Claims, 6 Drawing Sheets

Figure 1:
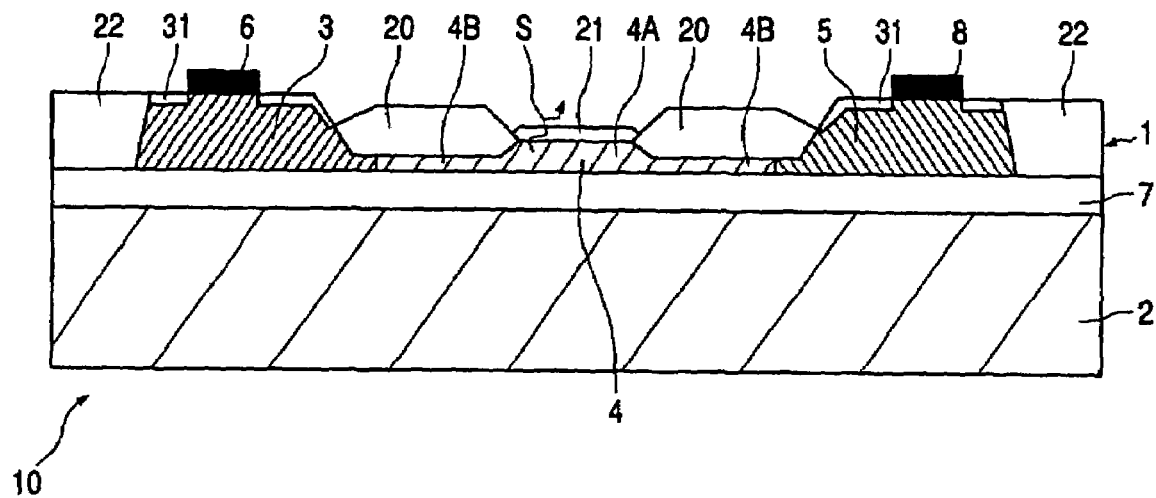

RADIATION EMITTING SEMICONDUCTOR DEVICE AND METHOD OF MANUFACTURING SUCH A DEVICE

The invention relates to a radiation-emitting semiconductor device comprising a silicon-containing semiconductor body and a substrate, which semiconductor body has a lateral semiconductor diode which is situated on an insulating layer that separates the diode from the substrate, which lateral semiconductor diode successively comprises a first semiconductor region of a first conductivity type and with a first doping concentration, a second semiconductor region of the first or a second conductivity type opposite to the first conductivity type and with a second doping concentration that is lower than the first doping concentration, and a third semiconductor region of the second conductivity type and with a third doping concentration that is higher than the second doping concentration, the first and the third semiconductor region each being provided with a connection region, and, during operation, radiation being generated in the second semiconductor region as a result of recombination of charge carriers injected from the first and the third semiconductor region in the second semiconductor region. Such a device, of which it has not been known until recently that during operation of the diode in the forward direction a usable quantity of radiation is emitted, constitutes an attractive alternative to a radiation-emitting device comprising a direct semiconductor material such as GaAs or ZnSe.

The invention relates to a method of manufacturing such a device.

United States patent specification U.S. Pat. No. 5,438,210 discloses a device of the type described in the opening paragraph. The known radiation-emitting semiconductor device comprises a silicon substrate covered with an insulating layer on which a semiconductor diode is present which is formed in a 2 μm-thick silicon film. The diode successively comprises a p+ type first semiconductor region, an n or p-type second semiconductor region and an n+-type third semiconductor region. During operation of the device, the diode serves as a silicon LED (=Light Emitting Diode). The device comprises a further diode that is aligned with respect to the LED and serves as a detector of the radiation emitted. The device thus forms a so-termed "opto-coupler" which can be used to form a galvanic separation between two electronic circuits.

A drawback of the known device resides in that it still emits a comparatively small quantity of radiation as compared to the above-mentioned semiconductor materials such as GaAs or ZnSe or other so-termed III-V or II-VI materials comprising a material with a direct band transition. In a material like silicon the band transition is indirect, as a result of which the radiation output is comparatively small.

It is an object of the invention to provide a device of the type mentioned in the opening paragraph, the light output of which is increased and which is also easy to manufacture.

To achieve this, in accordance with the invention, a radiation-emitting device of the type mentioned in the opening paragraph is characterized in that the second semiconductor region comprises a central portion that is surrounded by a further portion the bandgap of which is larger than that of the central portion. The invention is primarily based on the recognition that in a semiconductor material like silicon, the emission of radiation is limited due to a comparatively long period of time τ before a radiant recombination of a hole and an electron takes place. Said period of time τ is of the order of 40 μsec. As the diffusion coefficient D ($=\mu kT/Q$, where μ is the mobility, k is the Boltzmann constant, T is the absolute temperature and Q is the magnitude of the unit charge) of the charge carriers is of the order of 10 cm$^2$/sec, the diffusion path length L ($=\sqrt{(D^*\tau)}$) of the charge carriers is approximately 200 μm. This is much larger than the diffusion length of a radiation-generating recombination in a direct semiconductor material such as GaAs. The above implies that an electron hole pair in silicon can go looking, within a comparatively large distance (L) as it were, for a non-radiating recombination center present in the silicon. Thus, also at a comparatively low concentration of such centers of for example 10$^{13}$ cm$^{-3}$, a non-radiating recombination usually still takes place before a radiating recombination can take place. The invention is further based on the recognition that the freedom of movement of the charge carriers can be limited by providing a barrier in the semiconductor material, which causes the charge carriers to be confined as it were. A larger bandgap of the semiconductor material constitutes an effective barrier for electrons as well as holes. This can be achieved, for example, by reducing the bandgap of the central portion by adding, in said central portion, germanium to the silicon, as a result of which the bandgap of the surrounding portion is increased with respect to the central portion. A comparable result can be achieved by adding carbon to the silicon in the surrounding portion, as a result of which the bandgap of silicon is increased.

In a preferred embodiment of a radiation-emitting semiconductor device in accordance with the invention, the bandgap of the further portion is increased with respect to the central portion in that the thickness of said further portion is so small that quantum effects occur therein, whereas the thickness of the central portion is so large that said effects are substantially absent, yet small enough for a high efficiency. This modification is particularly attractive because, in this case, the device can be manufactured very readily as it can be made at least substantially entirely from silicon and because a locally small thickness of a semiconductor body can be readily produced in various ways. For example, a thin layer of silicon, wherein quantum effects occur, can be locally made thicker by means of local epitaxy. Also, a thicker layer of silicon, wherein no quantum effects occur, can be locally made thinner by etching.

In a particularly favorable modification, the thickness of the semiconductor body at the location of the further portion to be formed is reduced by means of a local oxidation of the semiconductor body. This has various advantages. For example, as a result of said process a properly passivated surface of silicon is obtained, so that non-radiant recombination of charge carriers at said surface is precluded or at least limited. In addition, in this manner a silicon region having a thickness such that quantum effects occur can be obtained in a very simple and accurate manner. If a silicon layer is oxidized to such an extent that the resultant silicon area reaches such a thickness, the (further) rate of oxidation is comparatively low. This contributes to the accuracy and reproducibility of the process carried out to obtain such a particularly thin silicon layer.

In a further embodiment, the thickness of the semiconductor body at the location of the central portion to be formed is reduced by means of a further local oxidation. By virtue of this modification, the starting thickness of the silicon semiconductor body wherein the diode is formed can be comparatively thick, for example 200 nm. A desirable thickness for the central portion is, for example, at least twice the thickness of the further portion, which has a thickness that preferably does not exceed 10 nm. The thickness of the semiconductor body enables the use of a customary SOI (=Silicon On Insulator) material. Also the possibility of forming electric connections and of forming further electronic and/or semiconductor elements in the semiconductor body is improved. However, it is also possible to use a much thinner semiconductor body having a thickness equal to that of the further portion. In the latter case, the central portion can be formed by means of selective (local) epitaxy.

In an advantageous embodiment, the central portion is provided, by means of ion implantation of suitable atoms, with sub-regions wherein the bandgap is increased with respect to the rest of the central portion. These regions can be formed, for example, by means of an implantation of silicon, germanium or oxygen atoms.

In a favorable further modification, the substrate is made of silicon. By virtue thereof, the device is highly compatible with customary IC (=Integrated Circuit) techniques wherein SOI is employed. For example, a silicon substrate may be used wherein, by means of an implantation of oxygen ions, a buried insulating layer of silicon dioxide is formed that serves as an insulating layer, and the semiconductor body is formed by a part of the substrate situated above the buried insulating layer. However, the semiconductor body can also advantageously be formed by means of the so-termed "smart cut" technique.

A method of manufacturing a radiation-emitting semiconductor device, wherein an insulating layer with a silicon-containing semiconductor body is present on a substrate, and a lateral semiconductor diode is formed in the semiconductor body, which semiconductor diode successively comprises a first semiconductor region of a first conductivity type and with a first doping concentration, a second semiconductor region of the first or a second conductivity type opposite to the first conductivity type and with a second doping concentration which is lower than the first doping concentration, and a third semiconductor region of the second conductivity type and with a third doping concentration which is higher than the second doping concentration, the first and the third semiconductor region each being provided with a connection region, and, during operation, radiation being generated in the second semiconductor region as a result of recombination of charge carriers injected from the first and the third semiconductor region in the second semiconductor region, characterized in that the second semiconductor region is provided with a central portion which is surrounded by a further portion the bandgap of which is increased with respect to that of the central portion. With such a method, a device in accordance with the invention is obtained.

Preferably, the bandgap of the further portion is increased by giving this portion a thickness which is so small that quantum effects can occur therein in the thickness direction, while the thickness of the central portion is chosen to be so large that these effects substantially do not occur. Such a method is comparatively simple and hence attractive. In a favorable modification, the thickness of the semiconductor body is reduced at the location of the further portion to be formed, by means of a local oxidation of the semiconductor body. The method is very compatible with customary IC technology. Preferably, the thickness of the semiconductor body is reduced at the location of the central portion to be formed, by means of a further local oxidation. By virtue thereof, use can be made of a comparatively thick semiconductor body to form silicon LEDs.

In a further embodiment of a method in accordance with the invention, silicon is chosen as the material for the substrate. A particularly attractive modification is obtained when the further portion and a first portion of the central portion are formed as a continuous layer, and a second portion, situated on the first portion, of the central portion is formed by means of selective epitaxy.

In another embodiment, suitable atoms are introduced into the central portion by means of ion implantation, as a result of which the bandgap of the central portion is locally increased with respect to the rest of the central portion. This enables the radiation output to be further improved. Preferably silicon or oxygen atoms are chosen as the implanted atoms.

These and other aspects of the invention are apparent from and will be elucidated with reference to the embodiment(s) described hereinafter.

Figure 2:
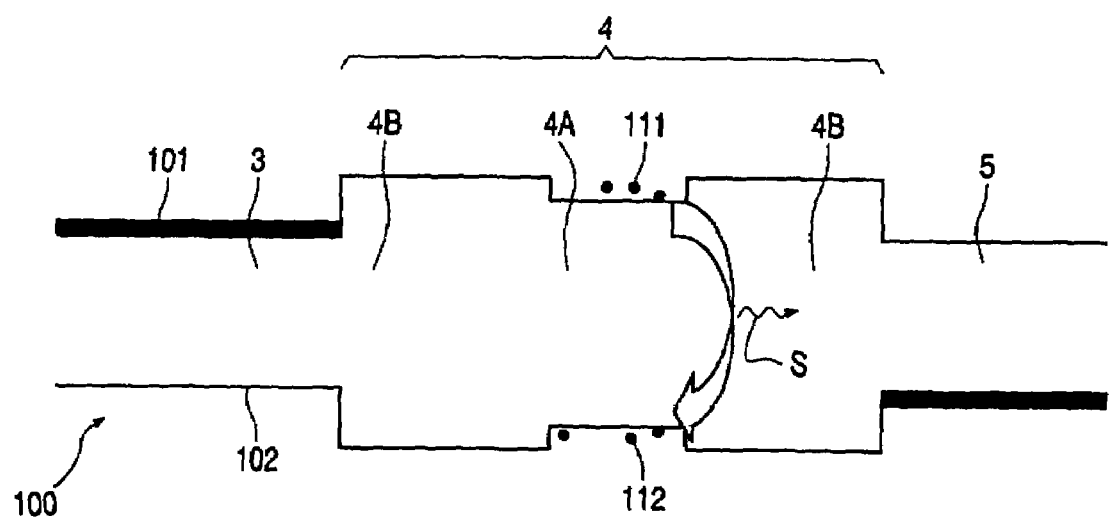

In the drawings:

FIG. 1 is a diagrammatic cross-sectional view, at right angles to the thickness direction, of a radiation-emitting semiconductor device in accordance with the invention, FIG. 2 diagrammatically shows the variation of the bandgap of the semiconductor body of the device shown in FIG. 1, and FIGS. 3 through 12 are diagrammatic cross-sectional views, at right angles to the thickness direction, of the device of FIG. 1 in successive stages of the manufacture by means of a method in accordance with the invention.

The Figures are not drawn to scale and some dimensions, such as notably the dimensions in the thickness direction, are exaggerated for clarity. Corresponding regions or parts in the different Figures are provided with the same reference numeral and the same hatching whenever possible.

FIG. 1 is a diagrammatic cross-sectional view, at right angles to the thickness direction, of a radiation-emitting semiconductor device in accordance with the invention. The device 10 comprises a silicon semiconductor body 1 and a substrate 2 which, in this case, is also made of silicon. The silicon semiconductor body 1, which is separated from the substrate 2 by means of an insulating layer 7, here of silicon dioxide, accommodates a lateral semiconductor diode with a first semiconductor region 3, here of the n-conductivity type, and with a doping concentration of approximately $10^{20}$ at/cm$^3$, a second semiconductor region 4, here of the n-conductivity type, and with a doping concentration of $10^{17}$ at./cm$^3$, and a third semiconductor region 5, here of the p-conductivity type, and with a doping concentration of $10^{20}$ at/cm$^3$. The first and the third semiconductor region 3, 5 are covered with a further insulating layer 31 of silicon dioxide having an aperture where said regions 3, 5 are each provided with a respective connection conductor 6, 8 of, in this case, aluminum or copper. On either side of the diode there are insulating regions 22 of silicon dioxide. In the case of operation in the forward direction of the diode, said diode serves as an LED as a part of the electrons injected from the first semiconductor region 3 into the second semiconductor region 4 recombine with a part of the holes injected from the third semiconductor region 5 into the second semiconductor region 4, thereby emitting radiation S having a wavelength of approximately 1100(+/−100) nm, which wavelength corresponds to the bandgap of silicon.

In accordance with the invention, the second semiconductor region 4 comprises a central portion 4A and a further portion 4B which surrounds the central portion 4A and has a larger bandgap than the central portion 4A. As a result, the free path length of charge carriers in silicon is limited such that, in spite of the substantial amount of time that passes before they enter into radiant recombination, they can reach no, or at least much fewer centers where non-radiant recombination can take place. As a result, the radiation output of a device 10 in accordance with the invention is increased as compared to that of the known device. In this example, the bandgap of the further portion 4B is increased with respect to the central portion 4A by giving the semiconductor body 1 such a small thickness at the location of the further portion 4B that quantum effects can occur therein. This takes place at a thickness below approximately 100 nm. In this example, the thickness of the further portion 4B is approximately 5 nm, while the thickness of the central portion 4A is approximately 100 nm. This means that the bandgap of the further portion 4B is approximately 30 meV larger than the bandgap of the central portion 4A.

FIG. 2 diagrammatically shows the variation of the bandgap in the semiconductor body 1 of the device 10 shown in this example. The Figure shows that, on either side of the central portion 4A, in the enveloping portion 4B a barrier is formed for the charge carriers in, respectively, the conduction band 101 and the valence band 102. Within the central portion 4A of the semiconductor region 4 shown in FIG. 1, charge carriers 111, 112 will be capable sooner of recombining while emitting radiation S.

The dimensions of the different regions in this example are as follows. The central portion 4A has lateral dimensions in the range between 200 nm and 1 μm, and in this example they are 500 nm. The width of the local oxidation region 20, by means of which the starting thickness of the semiconductor body 1 is reduced, in this example at the location of the further portion 4B, from approximately 200 nm to approximately 10 nm, here amounts to approximately 0.1 μm. The dimensions of the further local oxidation region 21, by means of which the starting thickness of the semiconductor body 1 of silicon is reduced, in this example at the location of the central portion 4A, from 200 nm to 100 nm, and at the location of the further portion 4B, from approximately 10 nm to approximately 5 nm, substantially correspond to the above-mentioned dimensions of the central portion 4A of the second semiconductor region 4. The lateral dimensions of the first and the third semiconductor region 3, 5 are approximately 1 μm, while the thickness there corresponds to the starting thickness of the semiconductor body 1, i.e. 200 nm.

In this example, the central portion 4A is symmetrical in the lateral direction. To obtain laser action, the central portion 4A can be given an elongated shape, with the dimension in the longitudinal direction being, for example, many times larger than the dimension in the width direction. In said case, the end portions of the central portion 4A must be provided with mirror surfaces. These can be formed, for example, by means of etching. In connection with the comparatively low oscillator strength in Si as compared to, for example, GaAs and taking into account the differences in effective mass of the charge carriers in said materials, a laser in silicon should have a length of the order of 1 cm to obtain an intensification comparable to that of GaAs. The feasibility is substantially increased if a length substantially below 1 cm would be possible. This can be achieved by rendering said mirror surfaces highly reflective, so that the reflection at one mirror surface is, for example, 0.99 and the reflection at the other mirror surface is 0.97. Such high reflection values can be obtained by covering the mirror surfaces with a suitable stack of dielectric layers and/or semiconductor layers.

In this example, the central portion 4A is provided with an ion implantation of oxygen atoms having a concentration which is so low that within the central portion 4A of the second semiconductor region 4 small local areas with a larger bandgap are formed, as it were. This also contributes to an increase of the radiation output. The local oxidation 20 and the further local oxidation 21 of silicon to silicon dioxide as well as the insulating layer 21 of silicon dioxide provide a barrier for the charge carriers in the thickness direction. These regions 7, 20, 21 also comprise a passive interface with the silicon semiconductor body 1. As a result, comparatively few charge carriers at said interface will recombine in a non-radiant manner. This has a favorable influence on the radiation output.

The manufacture of the device 10 of this example will now be explained.

Figure 3:
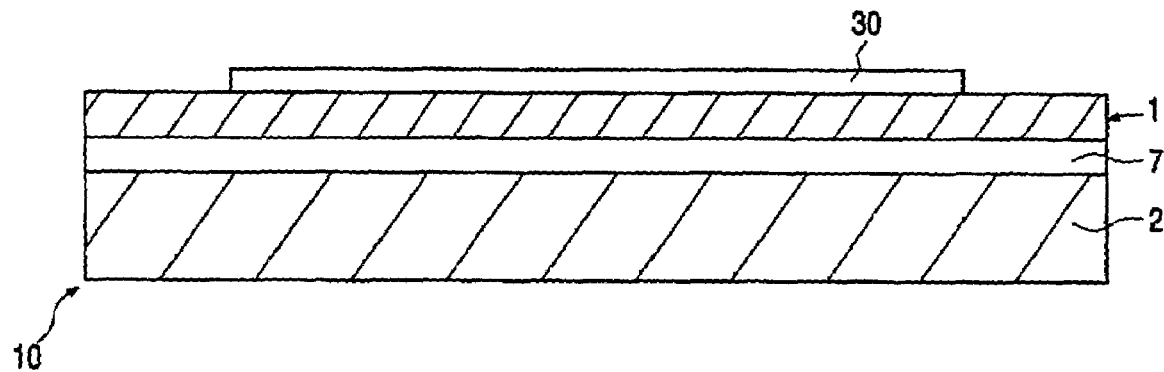
Figure 4:
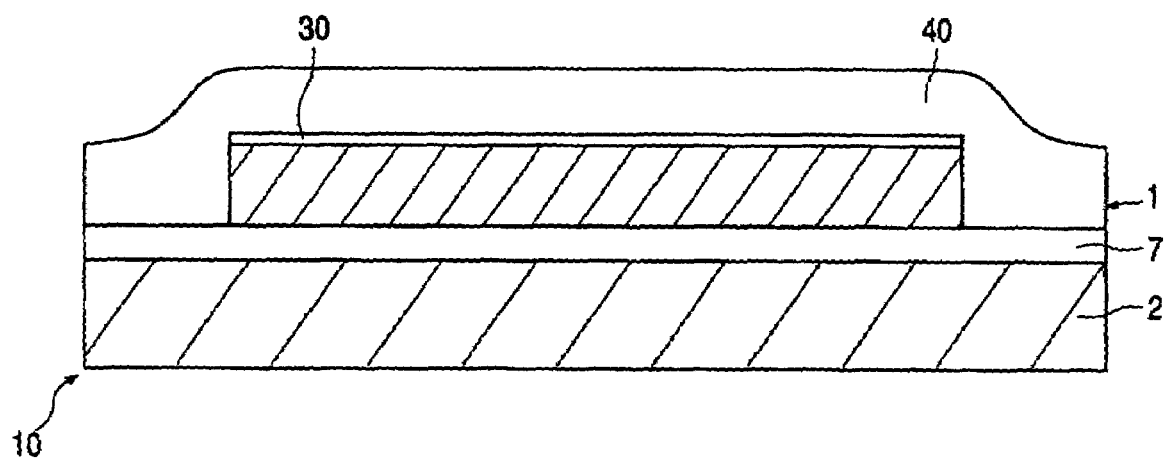
Figure 5:
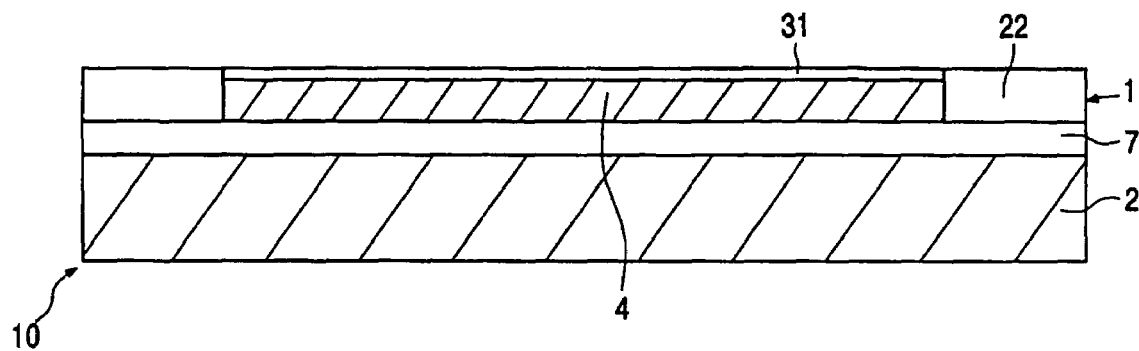
Figure 6:
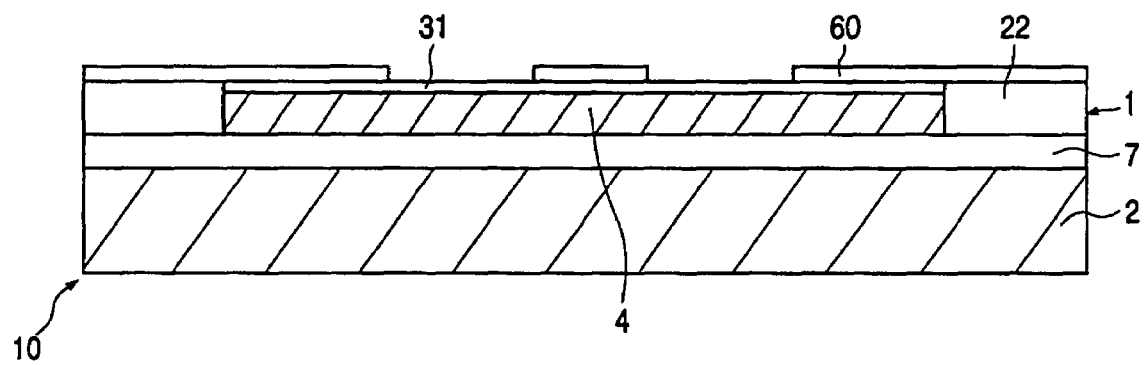
Figure 7:
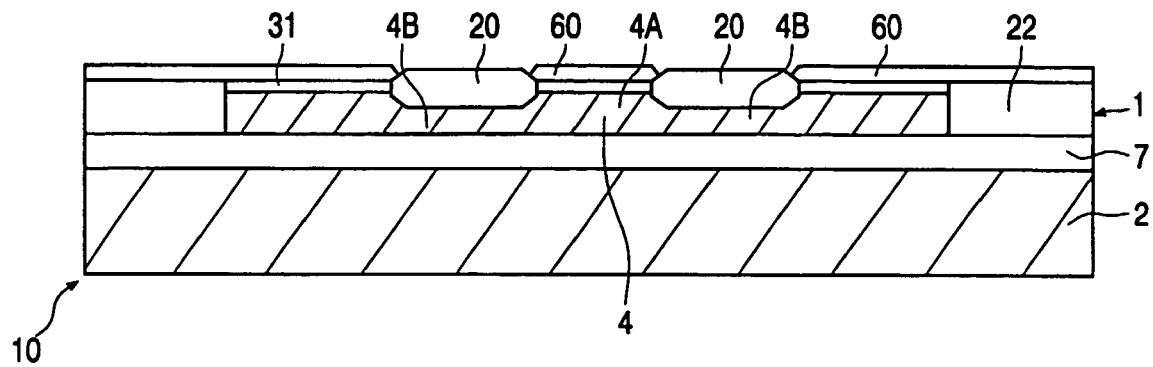

FIGS. 3 through 12 are diagrammatic cross-sectional views, at right angles to the thickness direction, of the device 10 of this example in successive stages of the manufacture by means of a method in accordance with the invention. There is started from (see FIG. 3) a semiconductor substrate 2 of n-type silicon on which an electrically insulating layer 7 of silicon dioxide is present. The semiconductor body 1 of silicon is situated on said electrically insulating layer. In this example, this structure is formed by means of the so-termed "smart cut" technique. Subsequently, a further insulating layer 30 is applied comprising, in succession, a thin layer of a thermal oxide and a layer of silicon nitride deposited thereon by means of CVD. The latter is patterned by means of photolithography and etching, as shown in FIG. 3.

Next (see FIG. 4), on either side of the diode to be formed, the semiconductor body 1 is locally removed above the insulating layer 7 by means of plasma etching. Subsequently, an insulating layer 40 of silicon dioxide is applied by means of CVD throughout the surface of the device 10. Said insulating layer is subsequently (see FIG. 5) removed above the insulating layer 30 by means of CMP (=Chemical Mechanical Polishing), as a result of which the device 10 becomes planar again and the insulating regions 22 are formed. In addition, the surface of the semiconductor body 1 is now covered with a thin, for example 10 nm thick, layer 31 of silicon dioxide by means of a thermal oxidation.

Figure 8:
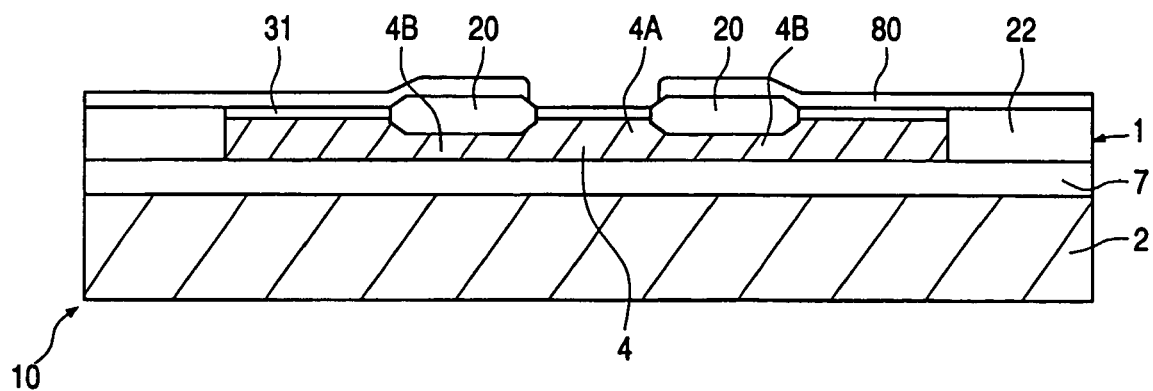
Figure 9:
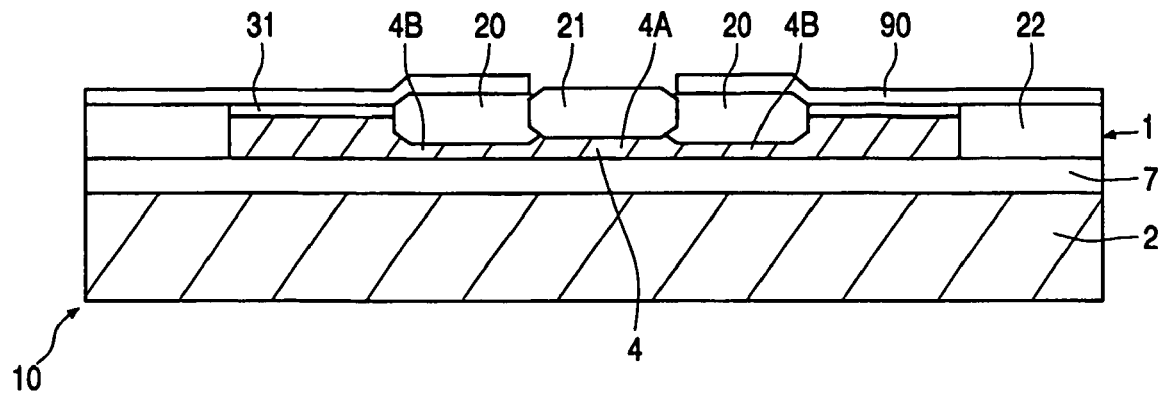

Next (see FIG. 6), the surface of the device 10 is provided with a 150 nm thick layer 60 of silicon nitride by means of CVD. A pattern is formed therein by means of photolithography and etching, after which (see FIG. 7) the local oxidation 20 is provided, causing the thickness of the insulating layer 31 to increase at the expense of the thickness of the semiconductor body 1, the thickness of which is locally reduced from 200 nm to approximately 10 nm. After the removal of the nitride layer 60, the device shown in FIG. 8 is obtained. Next an oxygen implant is provided, by means of a photoresist mask 80, in the central portion 4A to be formed of the second semiconductor region.

Figure 10:
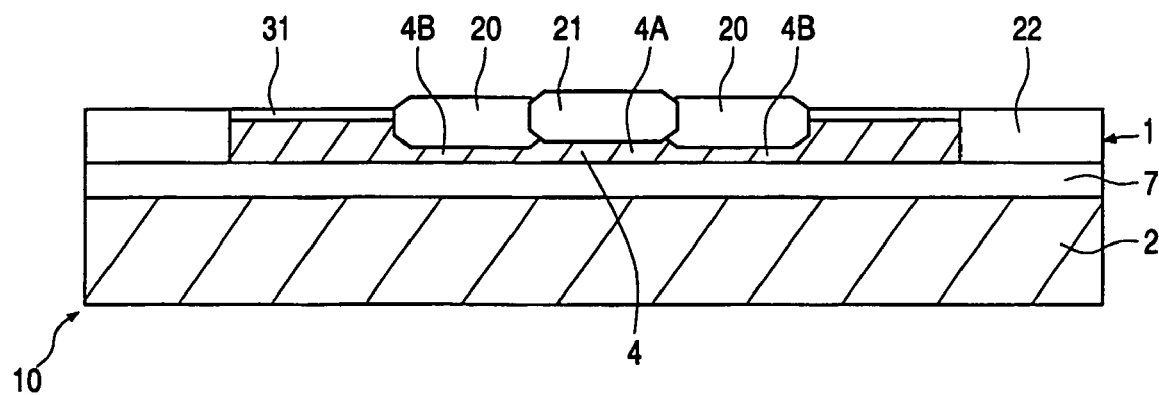
Figure 11:
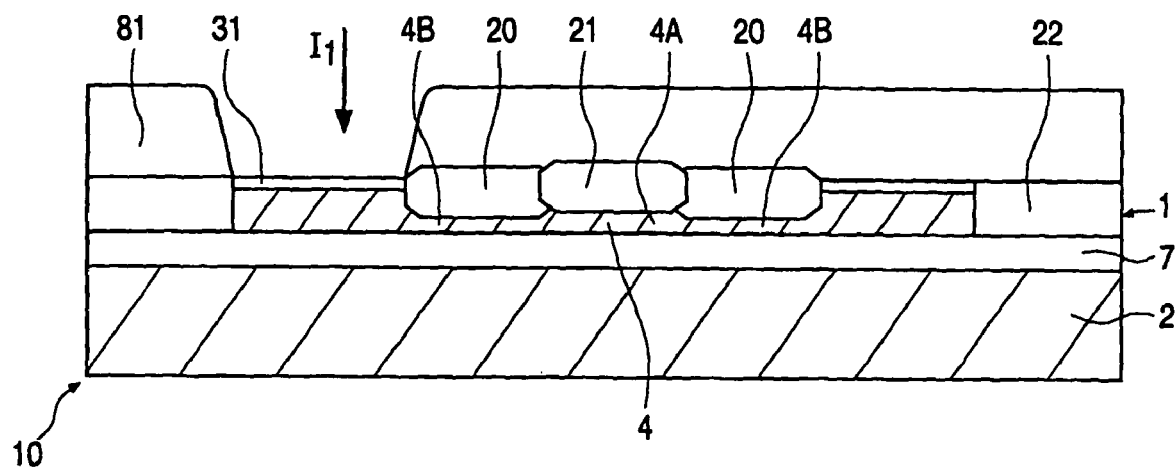
Figure 12:
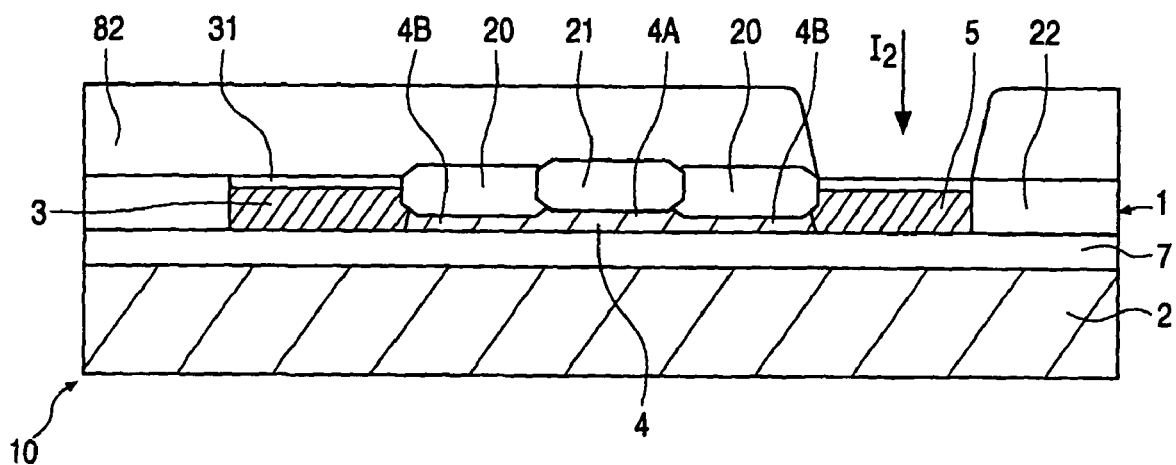

After the removal of the masking layer 80 (see FIG. 9), a further silicon nitride layer 90 is provided on the device and patterned. By means of a further local oxidation 21, the thickness of the semiconductor body 1 is reduced from 200 nm to approximately 100 nm at the location of the central portion 4A to be formed of the second semiconductor region 4. In this process, also the thickness of the semiconductor body 1 is further reduced to, in this example, the desired 5 nm at the location of the further portion to be formed. During this oxidation 21, also tempering takes place of the above-mentioned oxygen implant in the central portion 4A. After the removal of the nitride layer 90, the stage shown in FIG. 10 is obtained.

Next (see FIG. 11), a photoresist masking layer 81 is provided on the device 10 and subsequently patterned. By means of an implantation I1 of arsenic ions, the first semiconductor region 3 is formed in the semiconductor body 1. After the removal of the masking layer 81 (see FIG. 12), the third semiconductor region 5 is formed in a similar manner by means of an ion implantation I2 of boron ions using a masking layer 82. After the removal of said masking layer 82, both implantations I1, I2 are tempered in a thermal treatment, causing the atoms of the doping elements arsenic and boron to be electrically activated.

Subsequently (see FIG. 1), apertures are formed in the insulating layer 31 at the location of the first and the third semiconductor region 3, 5 by means of photolithography and etching. A subsequently vapor-deposited aluminum layer is then patterned by means of photolithography and etching, thereby forming the connection regions 6, 8. The device 10 is now ready for use. If the device 10 is integrated with a silicon IC comprising a circuit of transistors, it is advantageously possible, prior to the formation of the connection regions, to provide, if desirable, one or more further insulating layers wherein so-termed vias filled with metal plugs and conductor tracks are formed.

The invention is not limited to the example described herein since, within the scope of the invention, many variations and modifications are possible to those skilled in the art. For example, devices having a different geometry and/or different dimensions can be manufactured. Instead of a substrate of Si, an insulator can be used as the substrate. The further local oxidation can also be advantageously carried out prior to the local oxidation. This can be attributed to the fact that the thickness of the central portion is less critical than that of the further portion.

It is further noted that the desired relative increase of the bandgap of the further portion can also partly be realized by the introduction of stress in the further portion. Tension stress leads to a desired increase of the bandgap.

Finally, it is noted that the device may comprise further active and passive semiconductor elements or electronic components such as diodes and/or transistors and resistors and/or capacitors, whether or not in the form of an integrated circuit. These semiconductor elements or electronic components may be situated on or in parts of the semiconductor body on the outside of the insulating regions surrounding the diode. This has the particular advantage that a detector can be incorporated for the radiation emitted by the diode. Thus, optical communication can take place within an IC, for example by means of a radiation conductor provided on the surface of the device.

The invention claimed is:

1. A radiation-emitting semiconductor device comprising a semiconductor body and
   a substrate, which silicon-containing semiconductor device has a lateral semiconductor diode which is situated on an insulating layer that separates the diode from the substrate, which lateral semiconductor diode successively comprises
   a first semiconductor region of a first conductivity type and with a first doping concentration,
   a second semiconductor region of the first or a second conductivity type opposite to the first conductivity type and with a second doping concentration that is lower than the first doping concentration, and
   a third semiconductor region of the second conductivity type and with a third doping concentration that is higher than the second doping concentration, the first and the third semiconductor region each being provided with a connection region, and, during operation, radiation being generated in the second semiconductor region as a result of recombination of charge carriers injected from the first and the third semiconductor region in the second semiconductor region, characterized in that the second semiconductor region comprises a central portion that is surrounded by a further portion the bandgap of which is larger than that of the central portion.

2. A radiation-emitting semiconductor device as claimed in claim 1, characterized in that the baudgap of the silicon-containing semiconductor material is increased in the further portion in tat the thickness of said further portion is so small that quantum effects occur therein, whereas the thickness of the central portion is so large that said effects are substantially absent.

3. A radiation-emitting semiconductor device as claimed in claim 2, characterized in that the thickness of the semiconductor body at the location of the further portion to be formed is reduced by means of a local oxidation of the semiconductor body.

4. A radiation-emitting semiconductor device as claimed in claim 3, characterized in that the thickness of the semiconductor body at the location of the central portion to be formed is reduced by means of a further local oxidation.

5. A radiation-emiting semiconductor device as claimed in claim 2, characterized in that the thickness of the further portion is 10 nm at the most, and the thickness of the central portion is at least twice the thickness of the further portion.

6. A radiation-emitting semiconductor device as claimed in claim 2, characterized in that the central portion is provided with sub-regions wherein the bandgap is increased with respect to the rest of the central portion by means of an ion implantation of suitable atoms.

7. A radiation-emitting semiconductor device as claimed in claim 2, characterized in that the substrate is made of silicon.

8. A method of manufacturing a radiation-emitting semiconductor device, wherein an insulating layer with a silicon-containing semiconductor body is present on a substrate, and a lateral semiconductor diode is formed in the semiconductor body, which semiconductor diode successively comprises a first semiconductor region of a first conductivity type and with a first doping concentration, a second semiconductor region of the first or a second conductivity type opposite to the first conductivity type and with a second doping concentration which is lower than the first doping concentration, and a third semiconductor region of the second conductivity type and with a third doping concentration which is higher than the second doping concentration, the first and the third semiconductor region each being provided with a connection region, and, during operation, radiation being generated in the second semiconductor region as a result of recombination of charge carriers injected from the first and the third semiconductor region in the second semiconductor region, characterized in that the second semiconductor region is provided with a central portion which is surrounded by a further portion the bandgap of which is increased with respect to that of the central portion.

9. A method as claimed in claim 8, characterized in that the bandgap of the Timber portion is increased by giving this portion a thickness which is so small that quantum effects occur therein in the thickness direction, while the thickness of the central portion is chosen to be so large that these effects substantially do not occur.

10. A method as claimed in claim 9, characterized in that the thickness of the semiconductor body is reduced at the location of the further portion to be formed, by means of a local oxidation of the semiconductor body.

11. A method as claimed in claim 10, characterized in that the thickness of the semiconductor body is reduced at the location of the central portion to be formed, by means of a further local oxidation.

12. A method as claimed in claim 9, characterized in that the further portion and a first portion of the central portion are formed as a continuous layer, while a second portion situated on the first portion, of the central portion is formed by means of selective epitaxy.

13. A method as claimed in claim 8, characterized in that silicon is chosen as the material for the substrate.

14. A method as claimed in claim 8, characterized in that suitable atoms are introduced into the central portion by means of ion implantation, as a result of which the bandgap of the central portion is locally increased with respect to the rest of the central portion.

15. A method as claimed in claim 14, characterized in that germanium, silicon or oxygen atoms are chosen as the atoms implanted in the central portion.

* * * * *